United States Patent
Mizutani (10) Patent No.: US 9,677,912 B2
(45) Date of Patent: Jun. 13, 2017

(54) ROTATION ANGLE DETECTION DEVICE

(71) Applicant: DENSO CORPORATION, Kariya, Aichi-pref. (JP)

(72) Inventor: Akitoshi Mizutani, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/015,486

(22) Filed: Feb. 4, 2016

(65) Prior Publication Data

US 2016/0231139 A1  Aug. 11, 2016

(30) Foreign Application Priority Data

Feb. 6, 2015  (JP) .................................. 2015-22260

(51) Int. Cl.
| | |
|---|---|
| *G01B 7/14* | (2006.01) |
| *G01B 7/30* | (2006.01) |
| *G01R 33/06* | (2006.01) |
| *H01L 43/06* | (2006.01) |
| *G01D 5/14* | (2006.01) |
| *G01R 21/08* | (2006.01) |
| *G01R 15/20* | (2006.01) |
| *G01R 33/07* | (2006.01) |

(52) U.S. Cl.
CPC ............. *G01D 5/145* (2013.01); *G01D 5/142* (2013.01); *G01R 15/202* (2013.01); *G01R 21/08* (2013.01); *G01R 33/06* (2013.01); *G01R 33/07* (2013.01); *G01R 33/077* (2013.01)

(58) Field of Classification Search
CPC ...... G01D 5/142; G01R 15/20; G01R 15/202; G01R 21/08; G01R 33/06; G01R 33/07; G01R 33/077
USPC ........ 324/51, 55, 200, 207.11, 207.13, 207.2
See application file for complete search history.

(56) References Cited

U.S. PATENT DOCUMENTS

| | | | |
|---|---|---|---|
| 2007/0090831 A1 | 4/2007 | Matsumoto et al. | |
| 2011/0301913 A1* | 12/2011 | Matsumoto ............ | G01D 5/145 702/151 |
| 2012/0217959 A1* | 8/2012 | Kitade ................. | G01R 33/072 324/244 |
| 2013/0320967 A1* | 12/2013 | Honda .................... | G01D 5/145 324/207.2 |

* cited by examiner

*Primary Examiner* — Jermele M Hollington
*Assistant Examiner* — Raul Rios Russo
(74) *Attorney, Agent, or Firm* — Nixon & Vanderhye PC (57) ABSTRACT

A rotation angle detection device includes: a magnetic field generation portion that generates a magnetic field; and a first magnetism detection element and a second magnetism detection element disposed to have an angle of 90° therebetween in a rotation direction of the detection target and to rotate relative to the magnetism generation portion. The first magnetism detection element outputs a first output signal, and the second magnetism detection element outputs a second output signal. An amplitude shift correction circuit matches amplitudes of the first output signal and the second output signal which differ in phase by 90° from each other. A rotation angle computation circuit connected to the amplitude shift correction circuit computes and outputs a rotation angle of a detection target based on the first output signal and the second output signal having matched amplitudes.

8 Claims, 9 Drawing Sheets

ROTATION ANGLE DETECTION DEVICE

CROSS REFERENCE TO RELATED APPLICATION

This application is based on Japanese Patent Application No. 2015-22260 filed on Feb. 6, 2015, the disclosure of which is incorporated herein by reference in its entirety.

TECHNICAL FIELD

The present disclosure relates to a rotation angle detection device.

BACKGROUND

Figure 9:
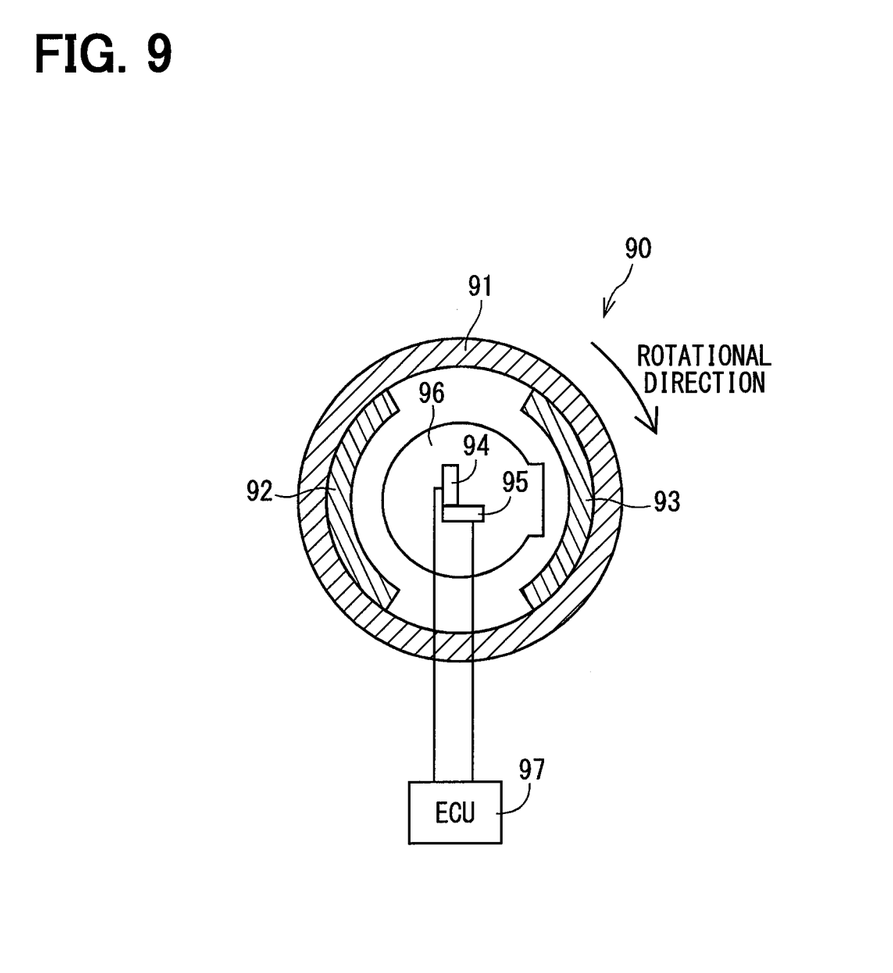
FIG. 9 is a schematic view of a conventional rotation angle detection device.

JP 2007-139739A (US 2007/0090831A) describes a rotation angle detection device to detect a rotation angle of various types of detection target. For example, as shown in FIG. 9, a rotation angle detection device 90 includes a cylindrical yoke 91, a pair of permanent magnets 92 and 93 as a magnetic field generation portion which rotates together with a detection target, Hall elements 94 and 95 as magnetism detection elements which rotate relative to the detection target, a support member 96 which fixes the Hall elements 94 and 95, and an engine control unit (ECU) 97 which executes a rotation angle detection program.

Figure 10A:
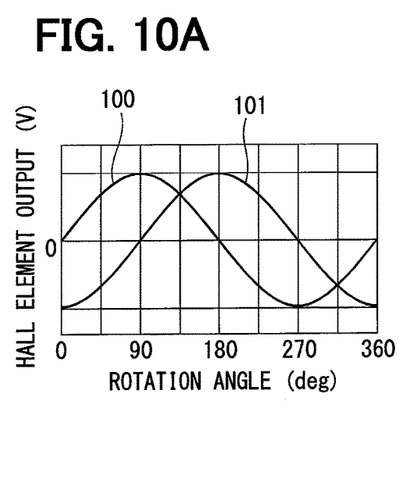
FIG. 10A and FIG. 10B are schematic views to describe a rotation angle detection method by the conventional rotation angle detection device.
Figure 10B:
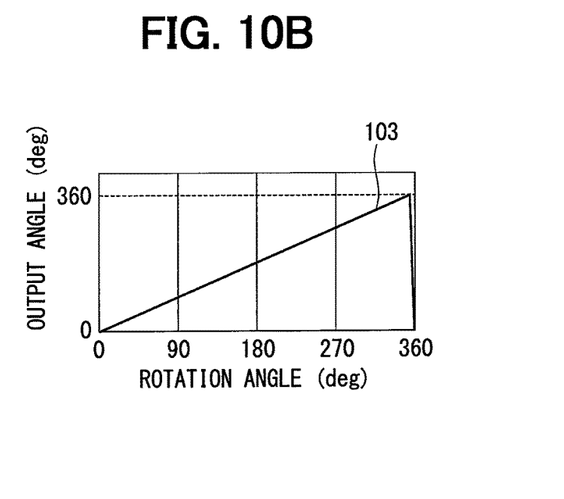

The Hall elements 94 and 95 are disposed to make an angle of 90° from each other in a rotational direction of the detection target. In response to a variation in the magnetic field caused by a rotation of the detection target, the Hall elements 94 and 95 output output signals 100 and 101, respectively. The output signals 100 and 101 are a sine-wave voltage and a cosine-wave voltage, respectively, which differ in phase by 90° from each other (see FIG. 10A). The ECU 97 detects a rotation angle 103 of the detection target on the basis of the output signals 100 and 101 (see FIG. 10B).

Figure 11A:
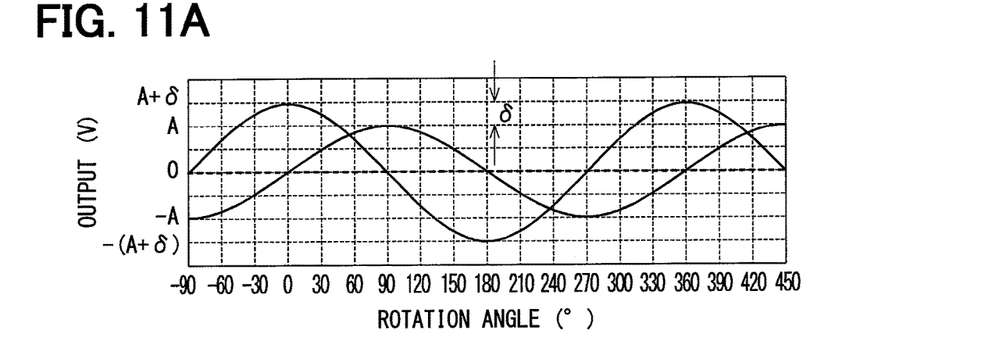
FIG. 11A and FIG. 11B are schematic views to describe outputs of the conventional rotation angle detection device.

The sensitivity of the rotation angle detection device 90 is adjusted before shipment so that amplitudes of the output signals 100 and 101, respectively, from the Hall elements 94 and 95 as the magnetism detection elements are matched. In practice, however, as shown in FIG. 11A, an adjustment shift δ occurs in amplitude between the sine-wave output signal and the cosine-wave output signal due to irregularity in sensitivity adjustment or the like.

Figure 11B:
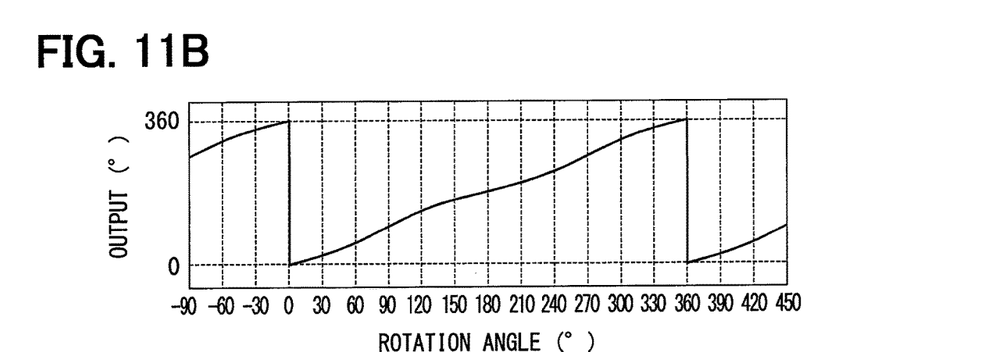

The ECU 97 detects the rotation angle 103 by performing an arc tangent computation by finding a ratio of the output signals 100 and 101. Hence, when an amplitude shift δ shown in FIG. 11A occurs between the sine-wave output signal and the cosine-wave output signal, an angular error (linearity error) is generated in a detected rotation angle as is shown in FIG. 11B.

SUMMARY

It is an object of the present disclosure to provide a rotation angle detection device which detects and outputs a rotation angle of a detection target at a high degree of accuracy even when an adjustment shift occurs in amplitude between output signals of magnetism detection elements due to irregularity in sensitivity adjustment.

According to an aspect of the present disclosure, a rotation angle detection device that detects a rotation angle of a detection target includes: a magnetic field generation portion that generates a magnetic field; and a first magnetism detection element and a second magnetism detection element disposed to rotate relative to the magnetic field generation portion due to a rotation of the detection target. Because the first magnetism detection element and the second magnetism detection element are arranged to have an angle of 90° therebetween in a rotational direction of the detection target, a first output signal and a second output signal respectively output from the first magnetism detection element and the second magnetism detection element differ in phase by 90° from each other.

The rotation angle detection device further includes an amplitude shift correction circuit. Hence, even when an adjustment shift occurs in amplitude between the first and second output signals, amplitudes of the first and second output signals can be matched.

The rotation angle detection device further includes a rotation angle computation circuit which computes a rotation angle based on the first and second output signals having matched amplitudes and outputs the computed rotation angle. Hence, a rotation angle of the detection target can be detected and outputted at a high degree of accuracy.

One of the first and second output signals is a reference signal, and the other is an amplitude correction target signal to be corrected in amplitude. The amplitude shift correction circuit may include a pulse signal generation circuit which generates a pulse signal indicating whether the amplitude correction target signal is negative or positive, an amplitude correction signal generation circuit which generates an amplitude correction signal by displacing a phase of the reference signal by 90° and subjecting the reference signal to full-wave rectification, and a multiplication processing circuit which applies multiplication processing to the amplitude correction signal and the pulse signal.

When configured as above, an amplitude corrected signal is generated by correcting an amplitude of the amplitude correction target signal to be equal to the amplitude of the reference signal. Hence, amplitudes of the first and second output signals can be matched.

The rotation angle detection device has two configurations for the reference signal and the amplitude correction target signal.

According to a first configuration, the reference signal is a Cos signal having an amplitude A and expressed as: $A \cdot \cos\theta$, and the amplitude correction target signal is a Sin signal having an amplitude A1, then the amplitude correction signal generation circuit generates an amplitude correction signal (Sin1 signal) expressed as: $A \cdot \sin\theta = (A^2 - (A \cdot \cos\theta)^2)^{1/2}$, and the multiplication processing circuit generates an amplitude corrected signal (Sin2 signal) having the amplitude A. Hence, the reference signal (Cos signal) and the amplitude corrected signal (Sin2 signal) have the same amplitude A.

According to a second configuration, the reference signal is a Sin signal having an amplitude A and expressed as: $A \cdot \sin\theta$, and the amplitude correction target signal is a Cos signal having an amplitude A1, then the amplitude correction signal generation circuit generates an amplitude correction signal (Cos1 signal) expressed as: $A \cdot \cos\theta = (A^2 - (A \cdot \sin\theta)^2)^{1/2}$, and the multiplication processing circuit generates an amplitude corrected signal (Cos2 signal) having the amplitude A. Hence, the reference signal (Sin signal) and the amplitude corrected signal (Cos2 signal) have the same amplitude A.

In the rotation angle detection device, the amplitude shift correction circuit may include a delay circuit. By delaying the reference signal for a predetermined time td in the delay circuit, the reference signal outputted by way of the delay circuit is synchronized with the amplitude corrected signal.

Hence, when a rotation angle of the detection target is computed in the rotation angle computation circuit on the basis of the reference signal and the amplitude corrected signal, a rotation angle can be detected at a high degree of accuracy without an angular error (linearity error) by eliminating an influence of a synchronization shift (phase shift) between the reference signal and the amplitude corrected signal.

In such a case, the delay time (predetermined time) td given to the reference signal by the delay circuit may be equal to a time necessary in the pulse signal generation circuit to generate a pulse signal from the amplitude correction target signal, in the amplitude correction signal generation circuit to generate a full-wave rectification signal, and in the multiplication processing circuit to generate the amplitude corrected signal by multiplication processing of the amplitude correction signal and the pulse signal.

In addition, the rotation angle computation circuit may detect and output a rotation angle of the detection target by performing an arc tangent computation using the reference signal and the amplitude corrected signal both outputted from the amplitude shift correction circuit.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Embodiments of the present disclosure will be described hereafter referring to drawings. In the embodiments, a part that corresponds to a matter described in a preceding embodiment may be assigned with the same reference numeral, and redundant explanation for the part may be omitted. When only a part of a configuration is described in an embodiment, another preceding embodiment may be applied to the other parts of the configuration. The parts may be combined even if it is not explicitly described that the parts can be combined. The embodiments may be partially combined even if it is not explicitly described that the embodiments can be combined, provided there is no harm in the combination.

First Embodiment

A rotation angle detection device of a first embodiment will be described using FIG. 1 through FIG. 5.

Figure 1:
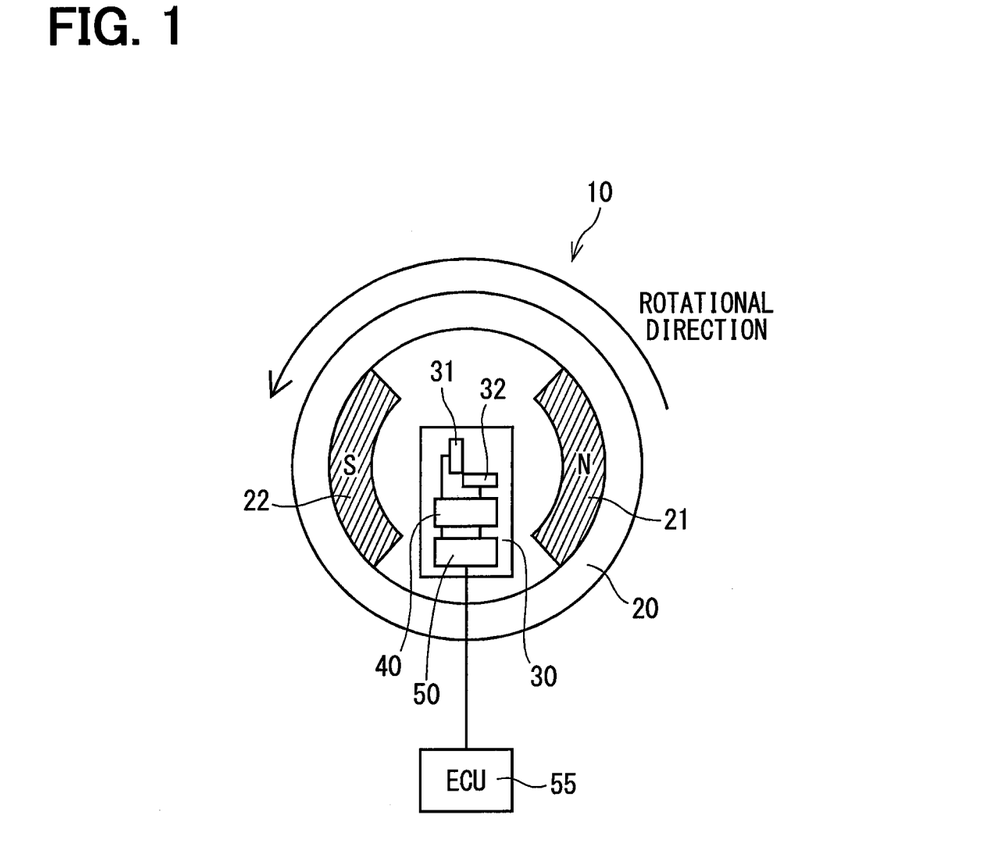
FIG. 1 is a schematic view illustrating a rotation angle detection device according to a first embodiment.

As is shown in FIG. 1, a rotation angle detection device 10 of this embodiment is a device configured to output a rotation angle of a detection target, and includes a yoke 20, a pair of permanent magnets 21 and 22, and a Hall IC 30. The Hall IC 30 includes a first Hall element 31, a second Hall element 32, an amplitude shift correction circuit 40, and a rotation angle computation circuit 50. A rotation angle signal finally output from the Hall IC 30 is sent to an electronic control unit (ECU) 55.

The yoke 20 and the permanent magnets 21 and 22 in a pair together form a magnetic field generation portion. The yoke 20 is connected to one end of a detection target. Each of the permanent magnets 21 and 22 in a pair is shaped like an arc and fixed to an inner peripheral wall of the yoke 20 of a cylindrical shape. The permanent magnets 21 and 22 in a pair are disposed 180° apart on opposite sides and form magnetic fields substantially parallel and having a substantially uniform density of magnetic flux. As is indicated by an arrow of FIG. 1, the yoke 20 and the permanent magnets 21 and 22 in a pair rotate together with the detection target.

The Hall IC 30 has the first Hall element 31 and the second Hall element 32 as first and second magnetism detection elements, respectively, the amplitude shift correction circuit 40, and the rotation angle computation circuit 50. The first Hall element 31 and the second Hall element 32 are disposed to form an angle of 90° therebetween in a rotational direction of the detection target and fixed to a support member which does not rotate in association with a rotation of the detection target. Hence, the first Hall element 31 and the second Hall element 32 rotate relative to the permanent magnets 21 and 22 in a pair in association with a rotation of the detection target.

Consequently, the first Hall element 31 and the second Hall element 32 output electrical signals which differ in phase by 90° from each other in response to a relative variation in the magnetic fields due to a relative rotation with respect to the permanent magnets 21 and 22 in a pair.

A drive method of the first Hall element 31 and the second Hall element 32 can be either a constant current drive method or a constant voltage drive method.

Figure 2:
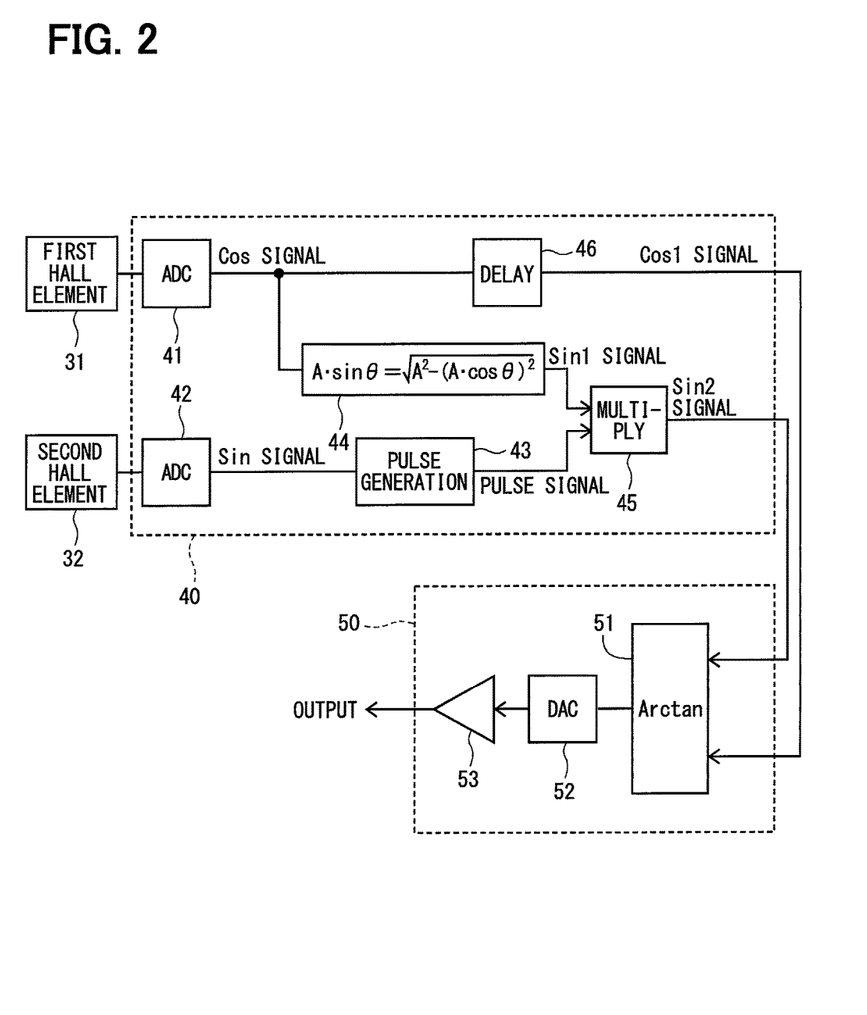
FIG. 2 is a schematic view illustrating an amplitude shift correction circuit and a rotation angle computation circuit in the rotation angle detection device of the first embodiment.

As shown in FIG. 2, the amplitude shift correction circuit 40 has an ADC (Analog to Digital Converter) 41 and an ADC 42 connected, respectively, to the first Hall element 31 and the second Hall element 32, a pulse signal generation circuit 43 connected to the ADC 42, an amplitude correction signal generation circuit 44 connected to the ADC 41, a multiplication processing circuit 45 connected to both of the pulse signal generation circuit 43 and the amplitude correction signal generation circuit 44, and a delay circuit 46 connected to the ADC 41. The multiplication processing circuit 45 and the delay circuit 46 are connected to the rotation angle computation circuit 50.

The ADC 41 converts an electrical signal from the first Hall element 31, for example, to a Cos signal by converting the signal from analog to digital. The ADC 42 converts an electrical signal from the second Hall element 32 to a Sin signal which is 90° out of phase from the Cos signal by converting the signal from analog to digital.

In this embodiment, a Cos signal having an amplitude A is a reference signal and a Sin signal having an amplitude A1 is an amplitude correction target signal.

Figure 3A:
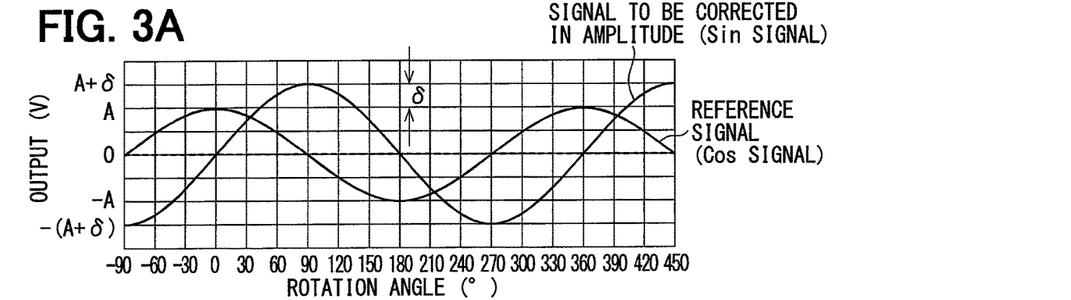
FIG. 3A through FIG. 3D are schematic views to describe a rotation angle detection method by the rotation angle detection device of the first embodiment.

As is shown in FIG. 3A, given that the reference signal (Cos signal) is expressed as: $A \cdot \cos\theta$, then the amplitude correction target signal (Sin signal) is expressed as: $(A+\delta) \cdot \sin\theta$, because an adjustment shift $\delta$ occurs in amplitude and the amplitude is given as A1 $(=A+\delta)$.

Figure 3B:
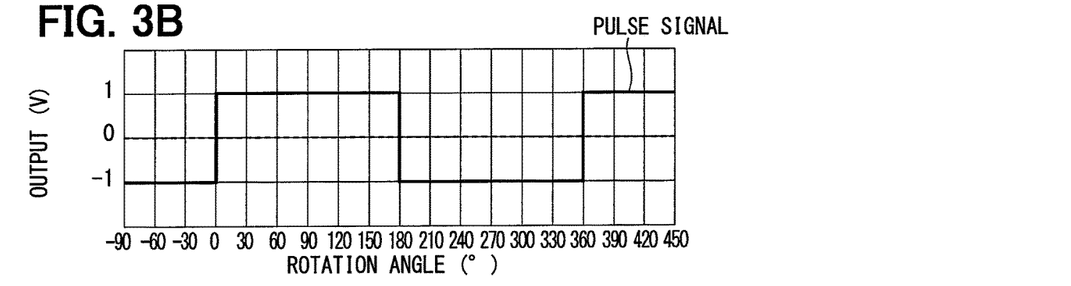

Also, as is shown in FIG. 3B, the pulse signal generation circuit 43 connected to the ADC 42 generates a rectangular pulse signal indicating whether the amplitude correction target signal (Sin signal) is negative or positive.

Figure 3C:
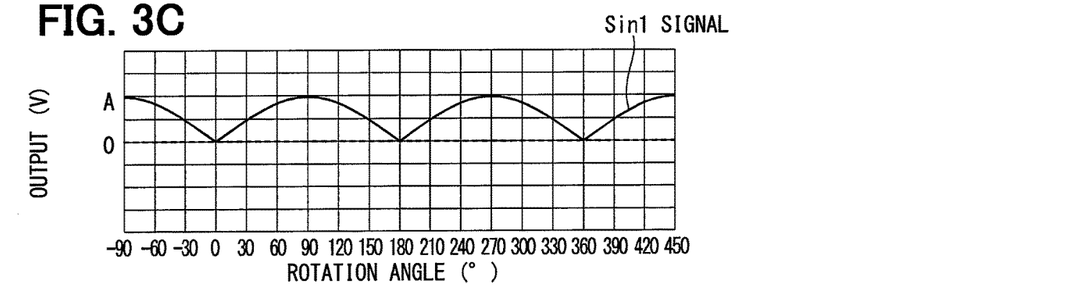

The amplitude correction signal generation circuit 44 connected to the ADC 41 generates an amplitude correction signal (Sin1 signal) as shown in FIG. 3C by displacing a phase of the reference signal (Cos signal) by 90° and subjecting the reference signal (Cos signal) to full-wave rectification, by which a negative part is inverted and made positive. Hence, the amplitude correction signal (Sin1 signal) is expressed as: $A \cdot \sin\theta = (A^2 - (A \cdot \cos\theta)^2)^{1/2}$.

The multiplication processing circuit 45 connected to both of the pulse signal generation circuit 43 and the amplitude correction signal generation circuit 44 applies multiplication processing to a pulse signal of the amplitude correction target signal (Sin signal) outputted from the pulse signal generation circuit 43 and the amplitude correction signal (Sin1 signal) outputted from the amplitude correction signal generation circuit 44 and thereby generates an amplitude corrected signal (Sin2 signal) having the amplitude A.

Figure 3D:
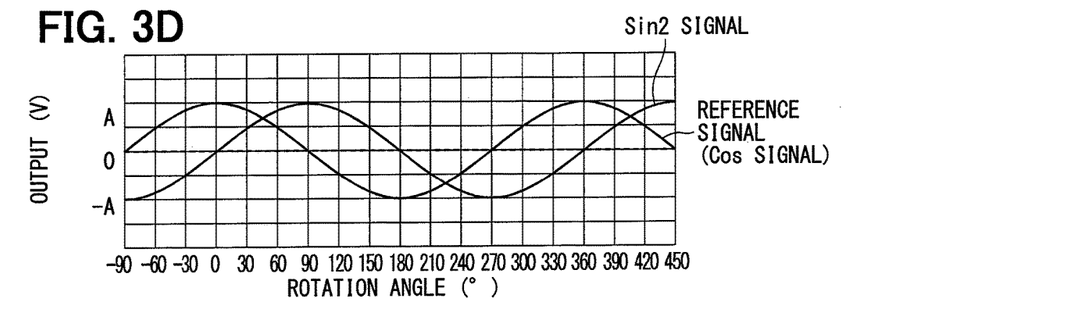

Hence, as is shown in FIG. 3D, the reference signal (Cos signal) and the amplitude corrected signal (Sin2 signal) have the same amplitude A. Electrical signals outputted from the first Hall element 31 and the second Hall element 32 are thus converted in the amplitude shift correction circuit 40, respectively, to the reference signal (Cos signal) and the amplitude corrected signal (Sin2 signal) having the same amplitude A, which are outputted to the rotation angle computation circuit 50.

At the point when the reference signal (Cos signal) and the amplitude correction target signal (Sin signal) are outputted, respectively, from the first Hall element 31 by way of the ADC 41 and from the second Hall element 32 by way of the ADC 42, the both signals differ in phase by 90° without any shift. However, because the amplitude corrected signal (Sin2 signal) is originally the amplitude correction target signal (Sin signal) outputted by way of the pulse signal generation circuit 43 and the multiplication processing circuit 45, a shift occurs with respect to a phase difference of 90° at the point when the amplitude corrected signal (Sin2 signal) is generated.

Hence, the amplitude corrected signal (Sin2 signal) lags the amplitude correction target signal (Sin signal) for a time necessary in the pulse signal generation circuit 43 to generate a pulse signal, in the amplitude correction signal generation circuit 44 to generate a full-wave rectification signal, and in the multiplication processing circuit 45 to generate the amplitude corrected signal (Sin2 signal). Although FIG. 3D shows a relation of an output voltage with respect to a rotation angle, the delay time of the amplitude corrected signal (Sin2 signal) from the reference signal (Cos signal) is not shown.

Figure 4:
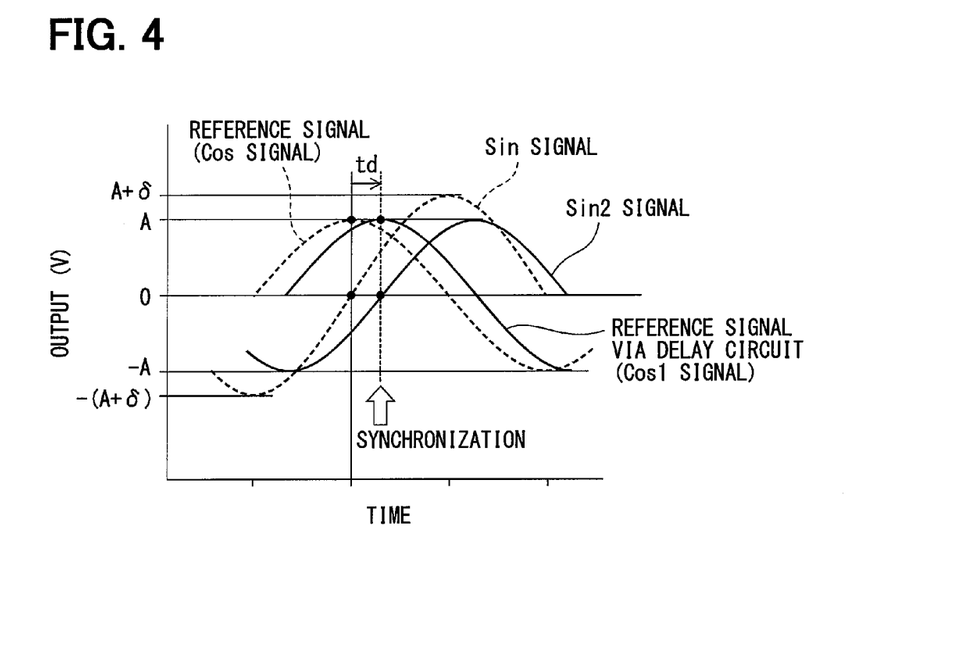
FIG. 4 is a schematic view to describe synchronization processing using a delay circuit provided to the amplitude shift correction circuit in the rotation angle detection device of the first embodiment.

Let td be a delay time of the amplitude corrected signal (Sin2 signal) from the amplitude correction target signal (Sin signal). Then, as is shown in FIG. 4, a phase shift of the delay time td occurs with respect to a regular phase difference) (90°) between the reference signal (Cos signal) and the amplitude corrected signal (Sin2 signal) outputted from the amplitude shift correction circuit 40 to the rotation angle computation circuit 50.

Assume that the reference signal (Cos signal) and the amplitude corrected signal (Sin2 signal) are outputted from the amplitude shift correction circuit 40 to the rotation angle computation circuit 50 with the phase shift of the delay time td. Then, when an arc tangent computation is performed in the rotation angle computation circuit 50 on the basis of the reference signal (Cos signal) and the amplitude corrected signal (Sin2 signal), the rotation angle calculated by the computation as above is highly likely to have a linearity error.

In order to forestall the occurrence of a linearity error in the rotation angle, the amplitude shift correction circuit 40 is provided with the delay circuit 46 connected to the ADC 41. As is shown in FIG. 4, the delay circuit 46 delays the reference signal (Cos signal) from the ADC 41 for the time td and changes the reference signal (Cos signal) to a reference signal (Cos1 signal). Hence, as is shown in FIG. 4, the reference signal (Cos1 signal) outputted by way of the delay circuit 46 is synchronized with the amplitude corrected signal (Sin2 signal) without any phase shift.

Consequently, the reference signal (Cos1 signal) and the amplitude corrected signal (Sin2 signal) having the same amplitude A without any phase shift are outputted from the amplitude shift correction circuit 40 to the rotation angle computation circuit 50.

As is shown in FIG. 2, the rotation angle computation circuit 50 has an arc tangent computation circuit 51 connected to both of the multiplication processing circuit 45 and the delay circuit 46 in the amplitude shift correction circuit 40, a DAC (Digital to Analog Converter) 52 connected to the arc tangent computation circuit 51, and a buffer 53 connected to the DAC 52.

The arc tangent computation circuit 51 receives the reference signal (Cos1 signal) and the amplitude corrected signal (Sin2 signal) inputted, respectively, from the delay circuit 46 and the multiplication processing circuit 45 in the amplitude shift correction circuit 40. The arc tangent computation circuit 51 calculates a rotation angle signal in a cycle of 360° by performing an arc tangent computation on the basis of the input signals. A rotation angle signal calculated in the arc tangent computation circuit 51 is converted from digital to analog in the DAC 52 and the resulting analog signal is further amplified by the buffer 53.

Figure 5:
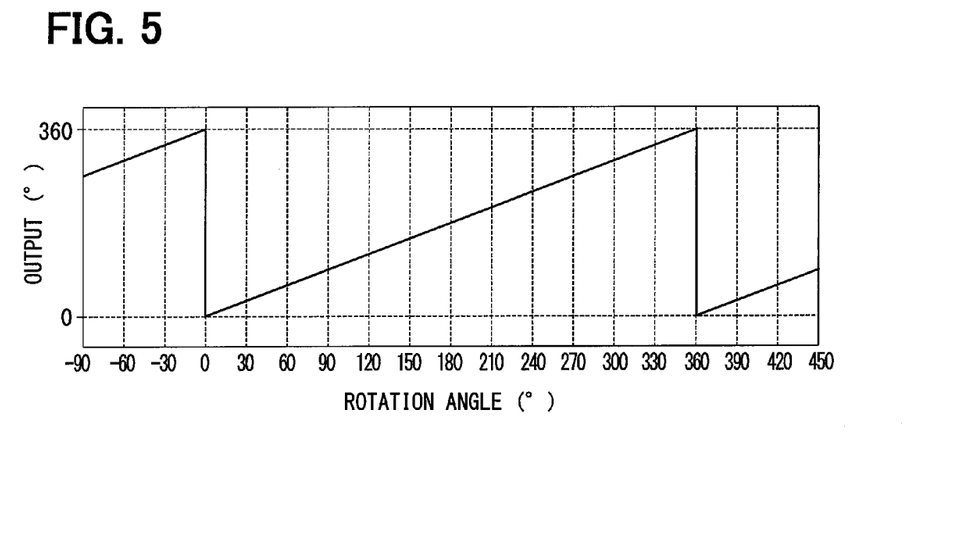
FIG. 5 is a view showing a rotation angle signal outputted from the rotation angle detection device of the first embodiment.

Consequently, a rotation angle signal of a detection target without an angular error (linearity error) as shown in FIG. 5 is outputted from the rotation angle computation circuit 50.

According to the first embodiment, electrical signals which are outputted from the first Hall element 31 and the second Hall element 32 in association with a rotation of a detection target and differ in phase by 90° from each other are converted in the amplitude shift correction circuit 40, respectively, to a Cos signal and a Sin signal. Further, the amplitude correction target signal (Sin signal) having an amplitude A1 $(=A+\delta)$ including an amplitude shift $\delta$ can be converted to the amplitude corrected signal (Sin2 signal) having the amplitude A same as the amplitude A of the reference signal (Cos signal) by the pulse signal generation circuit 43, the amplitude correction signal generation circuit 44, and the multiplication processing circuit 45.

In addition, the reference signal (Cos signal) is delayed and changed to the reference signal (Cos1 signal) by the delay circuit 46 in the amplitude shift correction circuit 40. A phase shift between the reference signal (Cos1 signal) and the amplitude corrected signal (Sin2 signal) can be eliminated by synchronizing the reference signal (Cos1 signal) with the amplitude corrected signal (Sin2 signal).

The reference signal (Cos1 signal) and the amplitude corrected signal (Sin2 signal) having the same amplitude A without a phase shift are outputted from the amplitude shift correction circuit 40 to the rotation angle computation circuit 50. A rotation angle signal can be thus calculated by an arc tangent computation in the rotation angle computation circuit 50. Consequently, a rotation angle of a detection target can be detected at a high degree of accuracy without an angular error (linearity error).

Second Embodiment

A rotation angle detection device of a second embodiment will be described using FIG. 6 through FIG. 8D.

Figure 6:
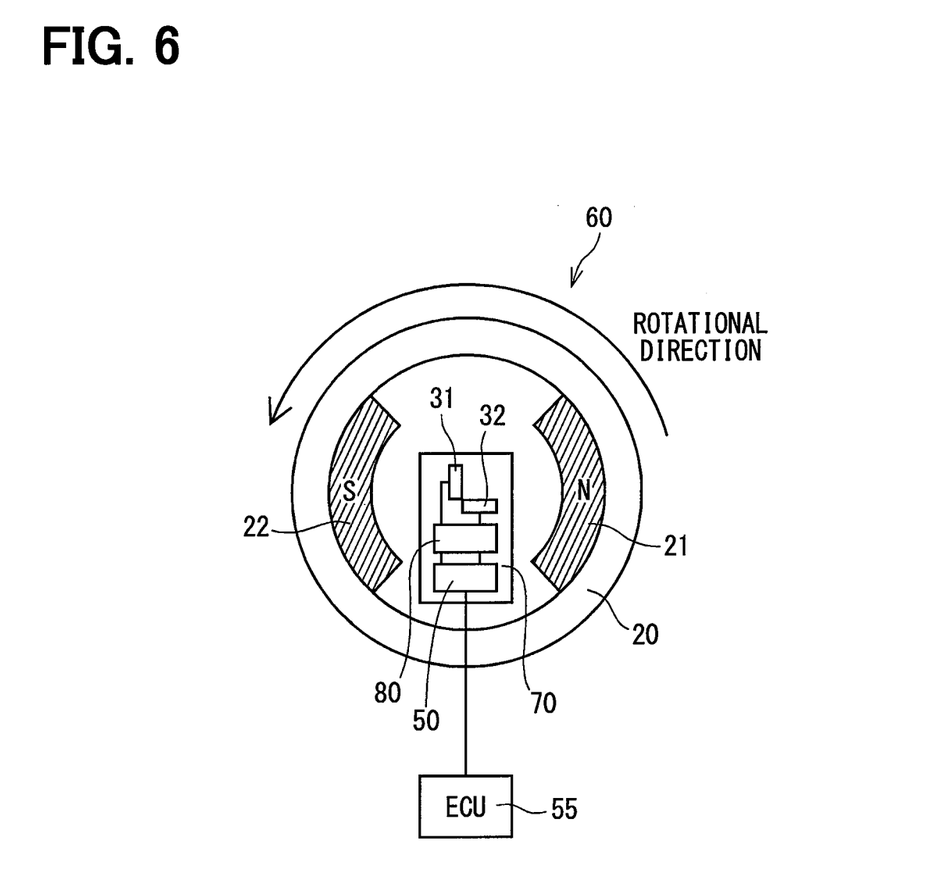
FIG. 6 is a schematic view illustrating a rotation angle detection device according to a second embodiment.

As is shown in FIG. 6, a rotation angle detection device 60 of this embodiment includes a yoke 20, a pair of permanent magnets 21 and 22, and a Hall IC 70. The Hall IC 70 includes a first Hall element 31, a second Hall element 32, an amplitude shift correction circuit 80, and a rotation angle computation circuit 50. A rotation angle signal finally output from the Hall IC 70 is sent to an ECU 55.

That is to say, in the rotation angle detection device 60 of this embodiment, the Hall IC 30 having the first Hall element 31, the second Hall element 32, the amplitude shift correction circuit 40, and the rotation angle computation circuit 50 in the first embodiment above is replaced with the Hall IC 70 having the first Hall element 31, the second Hall element 32, the amplitude shift correction circuit 80, and the rotation angle computation circuit 50.

Figure 7:
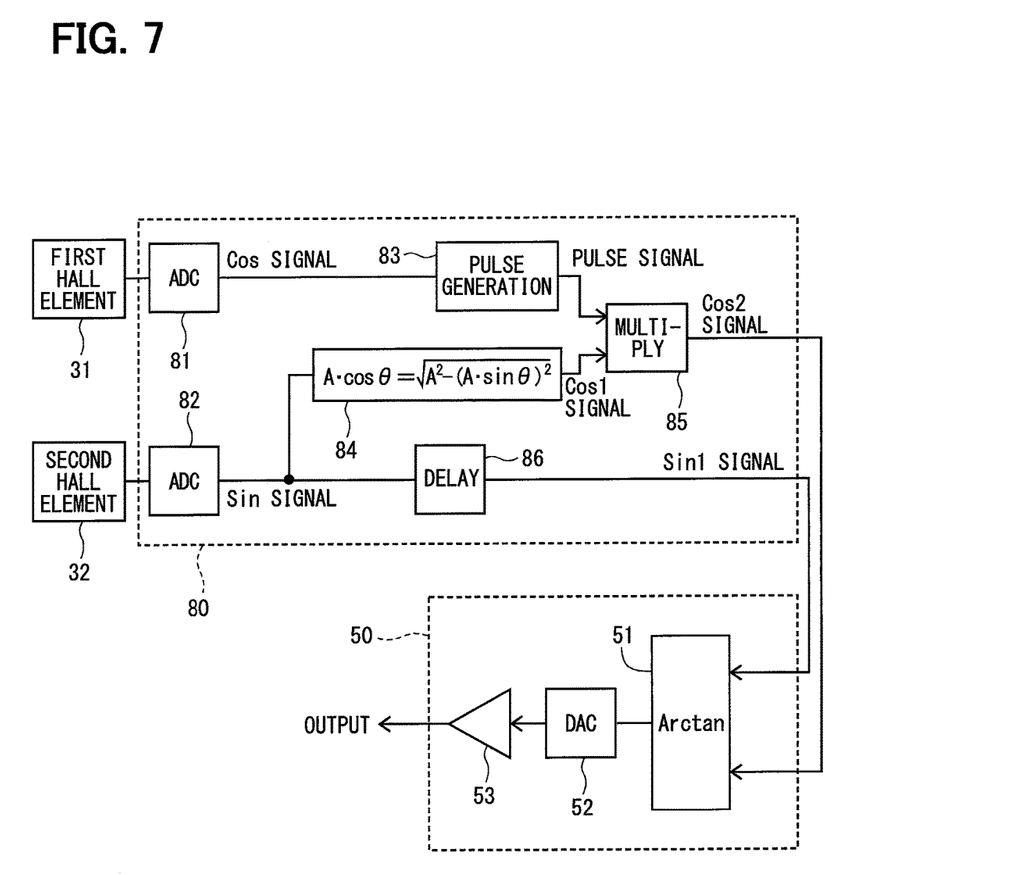
FIG. 7 is a schematic view illustrating an amplitude shift correction circuit and a rotation angle computation circuit in the rotation angle detection device of the second embodiment.

As is shown in FIG. 7, the amplitude shift correction circuit 80 has an ADC 81 and an ADC 82 connected, respectively, to the first Hall element 31 and the second Hall element 32, a pulse signal generation circuit 83 connected to the ADC 81, an amplitude correction signal generation circuit 84 connected to the ADC 82, a multiplication processing circuit 85 connected to both of the pulse signal generation circuit 83 and the amplitude correction signal generation circuit 84, and a delay circuit 86 connected to the ADC 82. The multiplication processing circuit 85 and the delay circuit 86 are connected to the rotation angle computation circuit 50.

The ADC 81 converts an electrical signal from the first Hall element 31, for example, to a Cos signal by converting the signal from analog to digital. The ADC 82 coverts an electrical signal from the second Hall element 32 to a Sin signal which is 90° out of phase from the Cos signal by converting the signal from analog to digital.

Figure 8A:
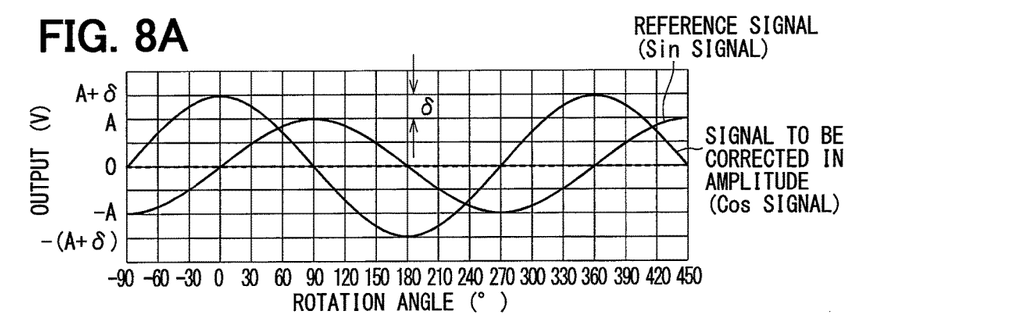
FIG. 8A through FIG. 8D are schematic views to describe a rotation angle detection method by the rotation angle detection device of the second embodiment.

In this embodiment, a Sin signal having an amplitude A is a reference signal and a Cos signal having an amplitude A1 is an amplitude correction target signal. As is shown in FIG. 8A, given that the reference signal (Sin signal) is expressed as: $A \cdot \sin\theta$, then the amplitude correction target signal (Cos signal) is expressed as: $(A+\delta) \cdot \cos\theta$, because an adjustment shift δ occurs in amplitude and the amplitude is given as A1 (=A+δ).

Figure 8B:
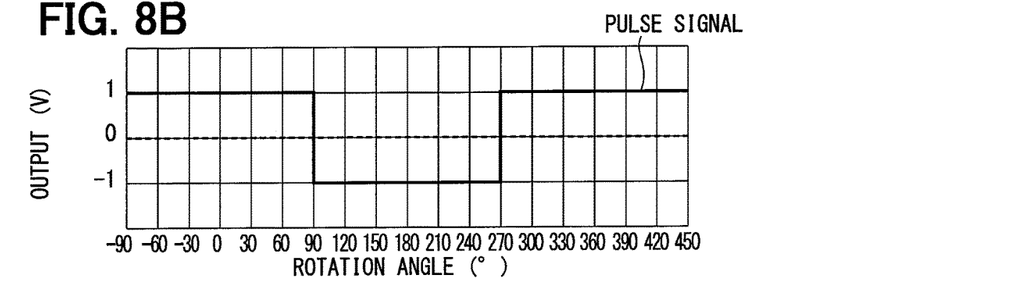

The pulse signal generation circuit 83 connected to the ADC 81 generates a rectangular pulse signal indicating whether the amplitude correction target signal (Cos signal) is negative or positive as shown in FIG. 8B.

Figure 8C:
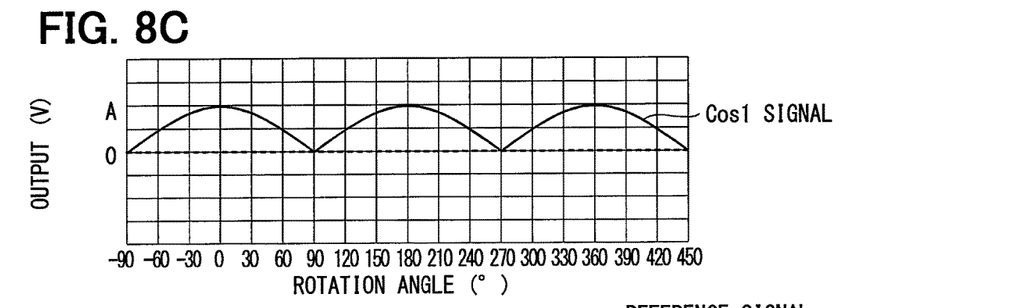

The amplitude correction signal generation circuit 84 connected to the ADC 82 generates an amplitude correction signal (Cos1 signal) as shown in FIG. 8C by displacing a phase of the reference signal (Sin signal) by 90° and subjecting the reference signal (Sin signal) to full-wave rectification, by which a negative part is inverted and made positive. Hence, the amplitude correction signal (Cos1 signal) is expressed as: $A \cdot \cos\theta = (A^2 - (A \cdot \sin\theta)^2)^{1/2}$.

The multiplication processing circuit 85 connected to both of the pulse signal generation circuit 83 and the amplitude correction signal generation circuit 84 applies multiplication processing to a pulse signal of the amplitude correction target signal (Cos signal) outputted from the pulse signal generation circuit 83 and the amplitude correction signal (Cos1 signal) outputted from the amplitude correction signal generation circuit 84 and thereby generates an amplitude corrected signal (Cos2 signal) having the amplitude A.

Figure 8D:
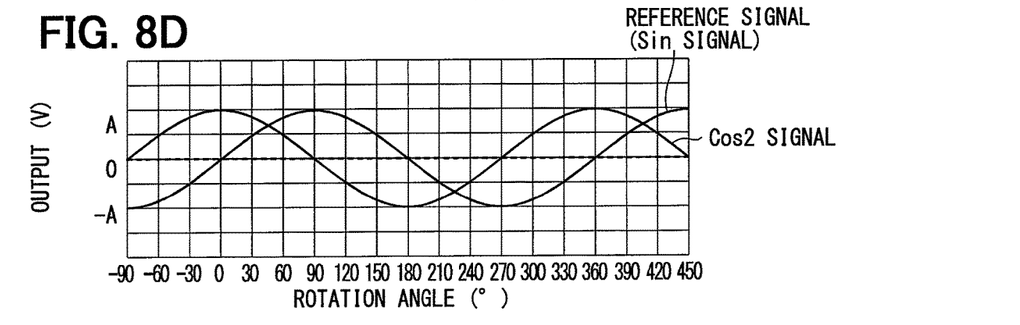

Hence, as is shown in FIG. 8D, the reference signal (Sin signal) and the amplitude corrected signal (Cos2 signal) have the same amplitude A. In the manner as above, electrical signals outputted from the first Hall element 31 and the second Hall element 32 are converted in the amplitude shift correction circuit 80, respectively, to the amplitude corrected signal (Cos2 signal) and the reference signal (Sin signal) having the same amplitude A, which are outputted to the rotation angle computation circuit 50.

At the point when the amplitude correction target signal (Cos signal) and the reference signal (Sin signal) are outputted, respectively, from the first Hall element 31 by way of the ADC 81 and from the second Hall element 32 by way of the ADC 82, the both signals differ in phase by 90° without any shift. However, because the amplitude corrected signal (Cos2 signal) is originally the amplitude correction target signal (Cos signal) outputted by way of the pulse signal generation circuit 83 and the multiplication processing circuit 85, a shift occurs with respect to a phase difference of 90° at the point when the amplitude corrected signal (Cos2 signal) is generated.

Hence, the amplitude corrected signal (Cos2 signal) lags the amplitude correction target signal (Cos signal) for a time necessary in the pulse signal generation circuit 83 to generate a pulse signal, in the amplitude correction signal generation circuit 84 to generate a full-wave rectification signal, and in the multiplication processing circuit 85 to generate the amplitude corrected signal (Cos2 signal). Although FIG. 8D shows a relation of an output voltage with respect to a rotation angle, the delay time of the amplitude corrected signal (Cos2 signal) from the reference signal (Sin signal) is not shown.

In consideration of lagging of the amplitude corrected signal (Cos2 signal) from the amplitude correction target signal (Cos signal), the amplitude shift correction circuit 80 is provided with the delay circuit 86 connected to the ADC 82. In the same manner as in the case described in the first embodiment above using FIG. 4, the delay circuit 86 delays the reference signal (Sin signal) from the ADC 82 for a time td and changes the reference signal (Sin signal) to a reference signal (Sin1 signal). Hence, the reference signal (Sin1 signal) outputted by way of the delay circuit 86 is synchronized with the amplitude corrected signal (Cos2 signal) without any phase shift.

Hence, the reference signal (Sin1 signal) and the amplitude corrected signal (Cos2 signal) having the same amplitude A without a phase shift are outputted from the amplitude shift correction circuit 80 to the rotation angle computation circuit 50. The rotation angle computation circuit 50 calculates a rotation angle signal in a cycle of 360° by performing an arc tangent computation on the basis of the reference signal (Sin1 signal) and the amplitude corrected signal (Cos2 signal). A rotation angle signal of a detection target calculated as above is outputted from the rotation angle computation circuit 50.

According to the second embodiment, electrical signals which are outputted from the first Hall element 31 and the second Hall element 32 in association with a rotation of a detection target and differ in phase by 90° from each other are converted in the amplitude shift correction circuit 80, respectively, to a Cos signal and a Sin signal. Further, the amplitude correction target signal (Cos signal) having an amplitude A1 (=A+δ) including an amplitude shift δ can be converted to the amplitude corrected signal (Cos2 signal) having the amplitude A same as the amplitude A of the reference signal (Sin signal) by the pulse signal generation circuit 83, the amplitude correction signal generation circuit 84, and the multiplication processing circuit 85.

In addition, the reference signal (Sin signal) is delayed and changed to the reference signal (Sin1 signal) by the delay circuit 86 in the amplitude shift correction circuit 80. A phase shift between the reference signal (Sin1 signal) and the amplitude corrected signal (Cos2 signal) can be eliminated by synchronizing the reference signal (Sin1 signal) with the amplitude corrected signal (Cos2 signal).

The reference signal (Sin1 signal) and the amplitude corrected signal (Cos2 signal) having the same amplitude A without a phase shift are outputted from the amplitude shift correction circuit 80 to the rotation angle computation circuit 50. A rotation angle signal can be thus calculated by an arc tangent computation in the rotation angle computation circuit 50. Consequently, a rotation angle of a detection target can be detected at a high degree of accuracy without an angular error (linearity error).

Other Embodiment

In the first and second embodiments above, the amplitude shift correction circuits 40 and 80 are incorporated into the Hall ICs 30 and 70, respectively, together with the first Hall element 31, the second Hall element 32, and the rotation angle computation circuit 50. It should be appreciated, however, that the amplitude shift correction circuits 40 and 80 are not necessarily incorporated into the Hall ICs 30 and 70, respectively. For example, the amplitude shift correction circuits 40 and 80 may be incorporated into the ECU 55 together with the rotation angle computation circuit 50.

In the first and second embodiments above, the first Hall element 31 and the second Hall element 32 are used as magnetism detection elements. It should be appreciated, however, that the magnetism detection elements are not limited to Hall elements. For example, anisotropic magneto-resistance elements and giant magneto-resistance elements are also available as the magnetism detection elements.

Such changes and modifications are to be understood as being within the scope of the present disclosure as defined by the appended claims.

What is claimed is:

1. A rotation angle detection device that detects a rotation angle of a detection target, the rotation angle detection device comprising:
    a magnetic field generation portion that generates a magnetic field;
    a first magnetism detection element and a second magnetism detection element disposed to have an angle of 90° therebetween in a rotation direction of the detection target and to rotate relative to the magnetic field generation portion due to a rotation of the detection target, the first magnetism detection element outputting a first output signal, the second magnetism detection element outputting a second output signal;
    an amplitude shift correction circuit that matches amplitudes of the first output signal and the second output signal which differ in phase by 90° from each other; and
    a rotation angle computation circuit connected to the amplitude shift correction circuit, wherein the rotation angle computation circuit computes and outputs a rotation angle of the detection target based on the first output signal and the second output signal having matched amplitudes.

2. The rotation angle detection device according to claim 1, wherein:
    one of the first output signal and the second output signal is a reference signal, and the other of the first output signal and the second output signal is an amplitude correction target signal,
    the amplitude shift correction circuit includes
        a pulse signal generation circuit which generates a pulse signal indicating whether the amplitude correction target signal is negative or positive,
        an amplitude correction signal generation circuit which generates an amplitude correction signal by displacing a phase of the reference signal by 90° and subjecting the reference signal to full-wave rectification, and
        a multiplication processing circuit which generates an amplitude corrected signal by applying multiplication processing to the amplitude correction signal and the pulse signal in order to correct an amplitude of the amplitude correction target signal to be equal to an amplitude of the reference signal.

3. The rotation angle detection device according to claim 2, wherein:
    the reference signal is a Cos signal having an amplitude A and expressed as: A·Cosθ,
    the amplitude correction target signal is a Sin signal having an amplitude A1,
    the amplitude correction signal generation circuit generates an amplitude correction signal (Sin1 signal) expressed as: $A \cdot \sin\theta = (A^2 - (A \cdot \cos\theta)^2)^{1/2}$, and the multiplication processing circuit generates an amplitude corrected signal (Sin2 signal) having the amplitude A.

4. The rotation angle detection device according to claim 2, wherein:
    the reference signal is a Sin signal having an amplitude A and expressed as: A·Sinθ,
    the amplitude correction target signal is a Cos signal having an amplitude A1,
    the amplitude correction signal generation circuit generates an amplitude correction signal (Cos1 signal) expressed as: $A \cdot \cos\theta = (A^2 - (A \cdot \sin\theta)^2)^{1/2}$, and
    the multiplication processing circuit generates an amplitude corrected signal (Cos2 signal) having the amplitude A.

5. The rotation angle detection device according to claim 2, wherein:
    the amplitude shift correction circuit includes a delay circuit which delays the reference signal for a predetermined time and synchronizes the reference signal outputted by way of the delay circuit with the amplitude corrected signal.

6. The rotation angle detection device according to claim 5, wherein:

the predetermined time given to the reference signal by the delay circuit is equal to a time necessary in the pulse signal generation circuit to generate the pulse signal from the amplitude correction target signal, in the amplitude correction signal generation circuit to generate a full-wave rectification signal, and in the multiplication processing circuit to generate the amplitude corrected signal by multiplication processing of the amplitude correction signal and the pulse signal.

7. The rotation angle detection device according to claim 2, wherein:
the rotation angle computation circuit detects and outputs a rotation angle of the detection target by performing an arc tangent computation using the reference signal and the amplitude corrected signal outputted from the amplitude shift correction circuit.

8. The rotation angle detection device according to claim 1, wherein:
the first magnetism detection element and the second magnetism detection elements are Hall elements.

* * * * *